United States Patent
Roy et al.

(10) Patent No.: US 7,986,753 B1
(45) Date of Patent: Jul. 26, 2011

(54) MODIFIED BRANCH METRIC FOR DECODERS AND EQUALIZERS

(75) Inventors: Pulakesh Roy, San Jose, CA (US); Keang-Po Ho, San Jose, CA (US)

(73) Assignee: Sibeam, Inc., Sunnyvale, CA (US)

( * ) Notice: Subject to any disclaimer, the term of this patent is extended or adjusted under 35 U.S.C. 154(b) by 888 days.

(21) Appl. No.: 11/901,069

(22) Filed: Sep. 14, 2007

Related U.S. Application Data

(60) Provisional application No. 60/845,573, filed on Sep. 18, 2006.

(51) Int. Cl.
   *H04L 27/06* (2006.01)
(52) U.S. Cl. ......................... 375/341; 714/755
(58) Field of Classification Search .................. 375/341; 714/755, 795
   See application file for complete search history.

(56) References Cited

U.S. PATENT DOCUMENTS

| | | | |
|---|---|---|---|
| 2006/0015797 A1* | 1/2006 | Miyaoka | 714/794 |
| 2006/0143554 A1* | 6/2006 | Sudhakar et al. | 714/795 |
| 2006/0150058 A1* | 7/2006 | Wang et al. | 714/755 |
| 2007/0076826 A1* | 4/2007 | Stockmanns et al. | 375/341 |

* cited by examiner

*Primary Examiner* — Emmanuel Bayard
(74) *Attorney, Agent, or Firm* — Blakely, Sokoloff, Taylor & Zafman LLP

(57) ABSTRACT

A modified branch metric for decoders and equalizers is described. In one embodiment the branch metric includes determining a set of branch metric values for symbols of a received digital signal, the branch metric values indicating a correlation between symbols obtained using a reduced calculation set, the reduced calculation set being obtained by adding a common term to all of the branch metric values before determining the correlation. The branch metric may be followed by determining path metrics for paths through a decision tree using the branch metric values, and selecting a path and a corresponding symbol sequence in the received digital signal using the path metric values.

20 Claims, 5 Drawing Sheets

MODIFIED BRANCH METRIC FOR DECODERS AND EQUALIZERS

CROSS-REFERENCE TO RELATED APPLICATIONS

This application claims the benefit of and incorporates by reference U.S. Provisional Application No. 60/845,573, entitled "Modified Branch Metric for Viterbi Algorithm," filed Sep. 18, 2006.

FIELD OF THE INVENTION

The present invention relates to the field of applying branch metric determinations, such as those for trellis-based error correction, convolutional codecs, channel equalizers, and partial response maximum likelihood signal recovery in communications and data storage, and, in particular, to a faster, simpler branch metric unit and determination.

BACKGROUND OF THE INVENTION

The Viterbi algorithm, developed by Andrew J. Viterbi, has been widely adopted in convolutional codes for digital communication, wireless local area networks, audio and video broadcasting, and cellular telephones, among others. The Viterbi algorithm is also used for maximum likelihood sequence estimation (MLSE) for channel equalization in a wide range of digital communication receivers, digital signal demodulation, and data storage. A derivative of the basic Viterbi algorithm is called the forward and backward Viterbi algorithm, or log-Max algorithm. This is used as an approximation to the maximum a posteriori probability (MAP) algorithm to decode Turbo codes.

Considering its application for convolutional codes as an example, for a simple rate-½ convolutional code, the encoder generates two outputs, $c_{k,1}$ and $c_{k,2}$, at each encoding state. Typically, these two outputs $c_{k,1}$ and $c_{k,2}$ are equal to either 0 or 1. 0 and 1 can also be thought of as logical false and logical true or as Boolean variables. In a convolutional encoder, the logical values of $c_{k,1}$ and $c_{k,2}$ depend on the input at the specific time, and on the state of the finite state machine that performs the encoding operations. The state of the finite state machine depends on previous inputs to the encoder.

When a rate-½ convolutional code is decoded by a receiver, the Viterbi algorithm takes two inputs $x_{k,1}$ and $x_{k,2}$. Mathematically, the Viterbi algorithm compares these two inputs $x_{k,1}$ and $x_{k,2}$ with the encoder output of $c_{k,1}$ and $c_{k,2}$. The values of $2c_{k,1}-1$ and $2c_{k,2}-1$ are compared with $x_{k,1}$ and $x_{k,2}$ in a stage by stage fashion. The branch metric unit of the Viterbi algorithm computes four branch metric values as $-x_{k,1}-x_{k,2}$, $-x_{k,1}+x_{k,2}$, $+x_{k,1}+x_{k,2}$ for all the possible correlations between $(2c_{k,m}-1)$ and $x_{k,m}$, m=1, 2. Computing and comparing all the possible correlations takes time and computing resources. Accordingly, the cost and delay in decoding convolutional code inhibit the use and adoption of convolutional codes and other communication techniques that may benefit from the Viterbi algorithm and other techniques that use branch metric determinations.

SUMMARY OF THE INVENTION

A modified branch metric for decoders and equalizers is described. In one embodiment the branch metric includes determining a set of branch metric values for symbols of a received digital signal, the branch metric values indicating a correlation between symbols obtained using a reduced calculation set, the reduced calculation set being obtained by adding a common term to all of the branch metric values before determining the correlation. The branch metric may be followed by determining path metrics for paths through a decision tree using the branch metric values, and selecting a path and a corresponding symbol sequence in the received digital signal using the path metric values.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE INVENTION

Figure 1:
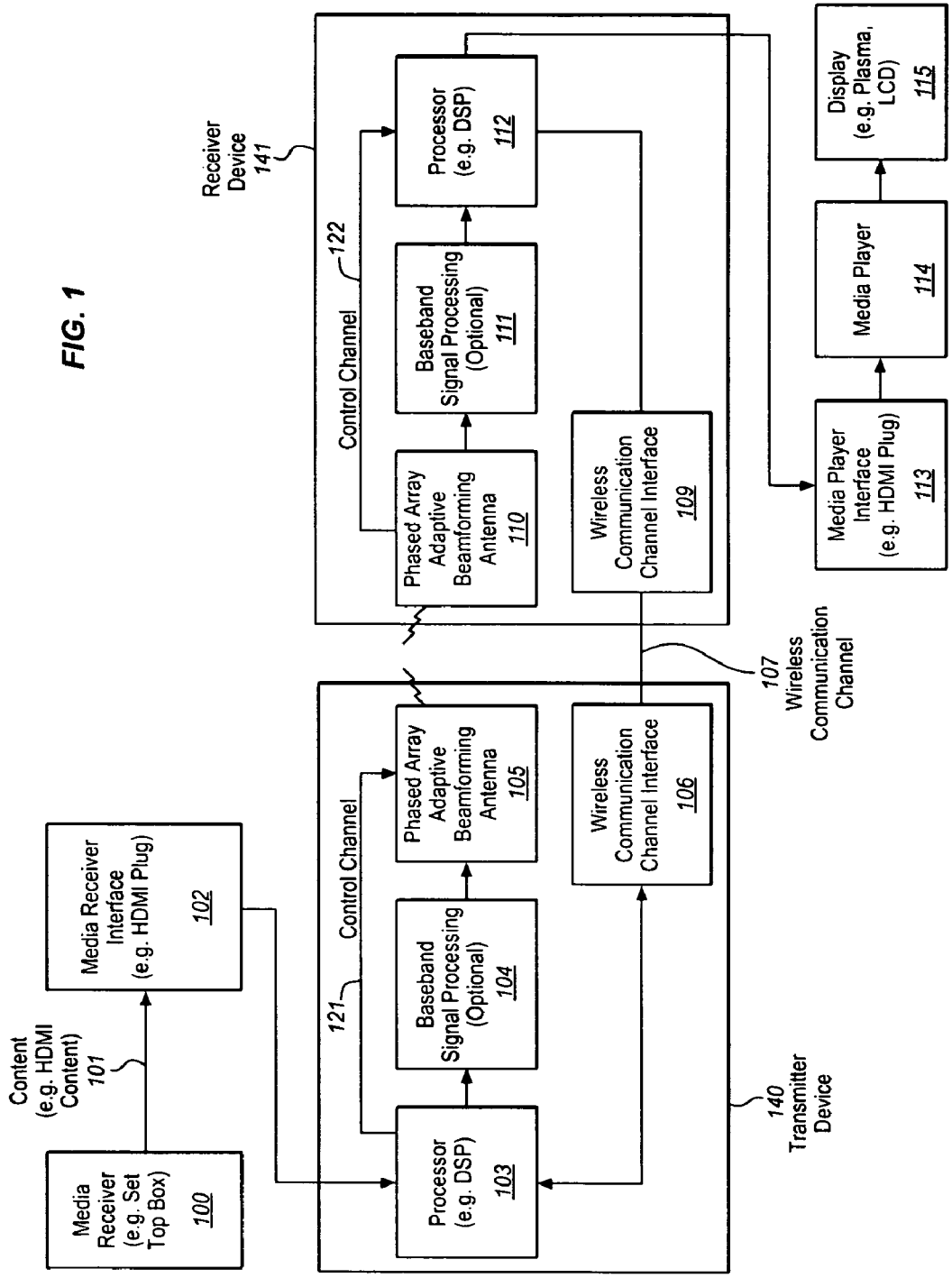
FIG. 1 is a block diagram of one embodiment of a communication system.

An apparatus and method for digital communications is disclosed. In one embodiment, a receiver for digital communication uses a Viterbi decoder with a branch metric unit. Without sacrificing system performance, branch metric computations are modified for simplified hardware or software implementation. The complexity of the branch metric unit for a typical decoder is reduced from 50% to 75%. The simplified branch metric unit can be applied to wide range of wired and wireless digital communication systems and data storage systems. It can also be applied to equalization, error correction, demodulation and other signal processing functions of a digital communication system.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical, cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

An Example of a Communication System

FIG. 1 is a block diagram of one embodiment of a communication system. Referring to FIG. 1, the system comprises media receiver 100, a media receiver interface 102, a transmitting device 140, a receiving device 141, a media player interface 113, a media player 114 and a display 115.

Media receiver 100 receives content from a source (not shown). In one embodiment, media receiver 100 comprises a set top box. The content may comprise baseband digital video, such as, for example, but not limited to, content adhering to the HDMI or DVI standards. In such a case, media receiver 100 may include a transmitter (e.g., an HDMI transmitter) to forward the received content.

Media receiver 101 sends content 101 to transmitter device 140 via media receiver interface 102. In one embodiment, media receiver interface 102 includes logic that converts content 101 into HDMI content. In such a case, media receiver interface 102 may comprise an HDMI plug and content 101 is sent via a wired connection; however, the transfer could occur through a wireless connection. In another embodiment, content 101 comprises DVI content.

In one embodiment, the transfer of content 101 between media receiver interface 102 and transmitter device 140 occurs over a wired connection; however, the transfer could occur through a wireless connection.

Transmitter device 140 wirelessly transfers information to receiver device 141 using two wireless connections. One of the wireless connections is through a phased array antenna with adaptive beamforming. The other wireless connection is via wireless communications channel 107, referred to herein as the back channel. In one embodiment, wireless communications channel 107 is uni-directional. In an alternative embodiment, wireless communications channel 107 is bi-directional.

Receiver device 141 transfers the content received from transmitter device 140 to media player 114 via media player interface 113. In one embodiment, the transfer of the content between receiver device 141 and media player interface 113 occurs through a wired connection; however, the transfer could occur through a wireless connection. In one embodiment, media player interface 113 comprises an HDMI plug. Similarly, the transfer of the content between media player interface 113 and media player 114 occurs through a wired connection; however, the transfer could occur through a wireless connection.

Media player 114 causes the content to be played on display 115. In one embodiment, the content is HDMI content and media player 114 transfer the media content to display via a wired connection; however, the transfer could occur through a wireless connection. Display 115 may comprise a plasma display, an LCD, a CRT, etc. Note that the system in FIG. 1 may be altered to include a DVD player/recorder in place of a DVD player/recorder to receive, and play and/or record the content.

Figure 3:
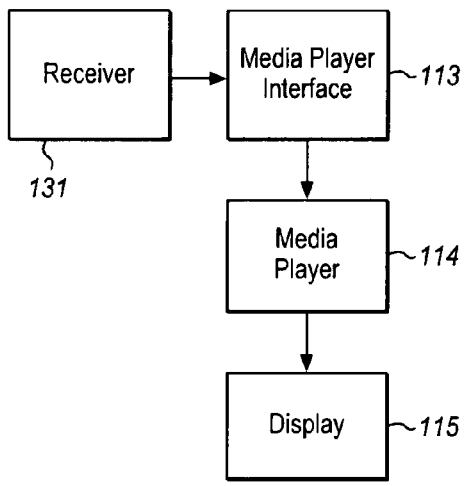
FIG. 3 is a block diagram of one embodiment of a peripheral device.

In one embodiment, transmitter 140 and media receiver interface 102 are part of media receiver 100. Similarly, in one embodiment, receiver 140, media player interface 113, and media player 114 are all part of the same device. In an alternative embodiment, receiver 140, media player interface 113, media player 114, and display 115 are all part of the display. An example of such a device is shown in FIG. 3.

In one embodiment, transmitter device 140 comprises a processor 103, an optional baseband processing component 104, a phased array antenna 105, and a wireless communication channel interface 106. Phased array antenna 105 comprises a radio frequency (RF) transmitter having a digitally controlled phased array antenna coupled to and controlled by processor 103 to transmit content to receiver device 141 using adaptive beamforming.

In one embodiment, receiver device 141 comprises a processor 112, an optional baseband processing component 111, a phased array antenna 110, and a wireless communication channel interface 109. Phased array antenna 110 comprises a radio frequency (RF) transmitter having a digitally controlled phased array antenna coupled to and controlled by processor 112 to receive content from transmitter device 140 using adaptive beamforming.

In one embodiment, processor 103 generates baseband signals that are processed by baseband signal processing 104 prior to being wirelessly transmitted by phased array antenna 105. In such a case, receiver device 141 includes baseband signal processing to convert analog signals received by phased array antenna 110 into baseband signals for processing by processor 112. In one embodiment, the baseband signals are orthogonal frequency division multiplexed (OFDM) signals. In one embodiment, the baseband signals are single carrier phase, amplitude, or both phase and amplitude modulated signals.

In one embodiment, transmitter device 140 and/or receiver device 141 are part of separate transceivers.

Transmitter device 140 and receiver device 141 perform wireless communication using phased array antenna with adaptive beamforming that allows beam steering. Beamforming is well known in the art. In one embodiment, processor 103 sends digital control information to phased array antenna 105 to indicate an amount to shift one or more phase shifters in phased array antenna 105 to steer a beam formed thereby in a manner well-known in the art. Processor 112 uses digital control information as well to control phased array antenna 110. The digital control information is sent using control channel 121 in transmitter device 140 and control channel 122 in receiver device 141. In one embodiment, the digital control information comprises a set of coefficients. In one embodiment, each of processors 103 and 112 comprises a digital signal processor.

Wireless communication link interface 106 is coupled to processor 103 and provides an interface between wireless communication link 107 and processor 103 to communicate antenna information relating to the use of the phased array antenna and to communicate information to facilitate playing the content at another location. In one embodiment, the information transferred between transmitter device 140 and receiver device 141 to facilitate playing the content includes encryption keys sent from processor 103 to processor 112 of receiver device 141 and one or more acknowledgments from processor 112 of receiver device 141 to processor 103 of transmitter device 140.

Wireless communication link 107 also transfers antenna information between transmitter device 140 and receiver device 141. During initialization of the phased array antennas 105 and 110, wireless communication link 107 transfers information to enable processor 103 to select a direction for the phased array antenna 105. In one embodiment, the information includes, but is not limited to, antenna location information and performance information corresponding to the antenna location, such as one or more pairs of data that include the position of phased array antenna 110 and the signal strength of the channel for that antenna position. In another embodiment, the information includes, but is not limited to, information sent by processor 112 to processor 103 to enable processor 103 to determine which portions of phased array antenna 105 to use to transfer content.

When the phased array antennas 105 and 110 are operating in a mode during which they may transfer content (e.g., HDMI content), wireless communication link 107 transfers an indication of the status of communication path from the processor 112 of receiver device 141. The indication of the status of communication comprises an indication from processor 112 that prompts processor 103 to steer the beam in another direction (e.g., to another channel). Such prompting may occur in response to interference with transmission of portions of the content. The information may specify one or more alternative channels that processor 103 may use.

In one embodiment, the antenna information comprises information sent by processor 112 to specify a location to which receiver device 141 is to direct phased array antenna 110. This may be useful during initialization when transmitter device 140 is telling receiver device 141 where to position its antenna so that signal quality measurements can be made to identify the best channels. The position specified may be an exact location or may be a relative location such as, for example, the next location in a predetermined location order being followed by transmitter device 140 and receiver device 141.

In one embodiment, wireless communications link 107 transfers information from receiver device 141 to transmitter device 140 specifying antenna characteristics of phased array antenna 110, or vice versa.

An Example of a Transceiver Architecture

Figure 2:
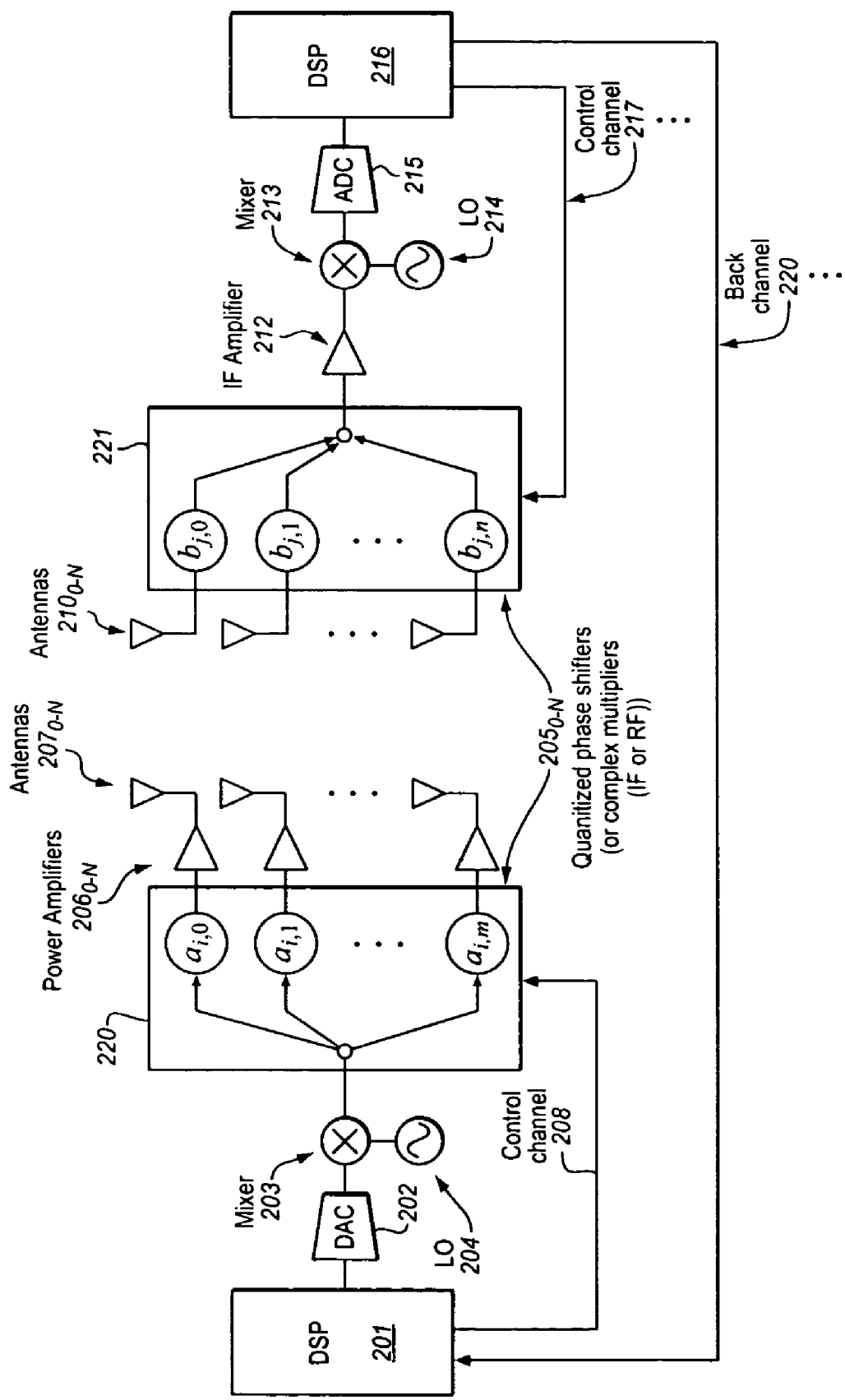
FIG. 2 is a more detailed block diagram of one embodiment of the communication system.

FIG. 2 is a block diagram of one embodiment of an adaptive beam forming multiple antenna radio system containing transmitter device 140 and receiver device 141 of FIG. 1. Transceiver 200 includes multiple independent transmit and receive chains. Transceiver 200 performs phased array beam forming using a phased array that takes an identical RF signal and shifts the phase for one or more antenna elements in the array to achieve beam steering.

Referring to FIG. 2, Digital Signal Processor (DSP) 201 formats the content and generates real time baseband signals. DSP 201 may provide modulation, FEC coding, packet assembly, interleaving and automatic gain control.

DSP 201 then forwards the baseband signals to be modulated and sent out on the RF portion of the transmitter. In one embodiment, the content is modulated into OFDM signals in a manner well known in the art.

Digital-to-analog converter (DAC) 202 receives the digital signals output from DSP 201 and converts them to analog signals. In one embodiment, the signals output from DAC 202 are between 0-256 MHz signals. In an alternative embodiment, the signals output from DAC 202 are between 0-750 MHz signals.

Mixer 203 receives signals output from DAC 202 and combines them with a signal from a local oscillator (LO) 204. The signals output from mixer 203 are at an intermediate frequency. In one embodiment, the intermediate frequency is between 2-15 GHz.

Multiple phase shifters $205_{0-N}$ receive the output from mixer 203. A demultiplier is included to control which phase shifters receive the signals. In one embodiment, these phase shifters are quantized phase shifters. In an alternative embodiment, the phase shifters may be replaced by complex multipliers. In one embodiment, DSP 201 also controls, via control channel 208, the phase and magnitude of the currents in each of the antenna elements in phased array antenna 220 to produce a desired beam pattern in a manner well-known in the art. In other words, DSP 201 controls the phase shifters $205_{0-N}$ of phased array antenna 220 to produce the desired pattern.

Each of phase shifters $205_{0-N}$ produce an output that is sent to one of power amplifiers $206_{0-N}$, which amplify the signal. The amplified signals are sent to antenna array 207 which has multiple antenna elements $207_{0-N}$. In one embodiment, the signals transmitted from antennas $207_{0-N}$ are radio frequency signals between 56-64 GHz. Thus, multiple beams are output from phased array antenna 220.

With respect to the receiver, antennas $210_{0-N}$ receive the wireless transmissions from antennas $207_{0-N}$ and provide them to phase shifters $211_{0-N}$. As discussed above, in one embodiment, phase shifters $211_{0-N}$ comprise quantitized phase shifters. Alternatively, phase shifters $211_{0-N}$ may be replaced by complex multipliers. Phase shifters $211_{0-N}$ receive the signals from antennas $210_{0-N}$, which are combined to form a single line feed output. In one embodiment, a multiplexer is used to combine the signals from the different elements and output the single feed line. The output of phase shifters $211_{0-N}$ is input to intermediate frequency (IF) amplifier 212, which reduces the frequency of the signal to an intermediate frequency. In one embodiment, the intermediate frequency is between 2-9 GHz.

Mixer 213 receives the output of the IF amplifier 212 and combines it with a signal from LO 214 in a manner well-known in the art. In one embodiment, the output of mixer 213 is a signal in the range of 0 to about 250 MHz. In one embodiment, there are I and Q signals for each channel. In an alternative embodiment, the output of mixer 213 is a signal in the range of 0 to about 750 MHz.

Analog-to-digital converter (ADC) 215 receives the output of mixer 213 and converts it to digital form. The digital output from ADC 215 is received by DSP 216. DSP 216 restores the amplitude and phase of the signal. DSPs 211 may provide demodulation, packet disassembly, de-interleaving, FEC decoding, and automatic gain control.

In one embodiment, each of the transceivers includes a controlling microprocessor that sets up control information for DSP. The controlling microprocessor may be on the same die as the DSP.

DSP-Controlled Adaptive Beam Forming

In one embodiment, the DSPs implement an adaptive algorithm with the beam forming weights being implemented in hardware. That is, the transmitter and receiver work together to perform the beam forming in RF frequency using digitally controlled analog phase shifters; however, in an alternative embodiment, the beamforming is performed in IF. Phase shifters $205_{0-N}$ and $211_{0-N}$ are controlled via control channel 208 and control channel 217, respectfully, via their respective DSPs in a manner well known in the art. For example, DSP 201 controls phase shifters $105_{0-N}$ to have the transmitter perform adaptive beamforming to steer the beam while DSP 211 controls phase shifters $211_{0-N}$ to direct antenna elements to receive the wireless transmission from antenna elements and combine the signals from different elements to form a single line feed output. In one embodiment, a multiplexer is used to combine the signals from the different elements and output the single feed line.

DSP 201 performs the beam steering by pulsing, or energizing, the appropriate phase shifter connected to each antenna element. The pulsing algorithm under DSP 201 controls the phase and gain of each element. Performing DSP controlled phase array beamforming is well known in the art.

The adaptive beam forming antenna is used to avoid interfering obstructions. By adapting the beam forming and steering the beam, the communication can occur avoiding obstructions which may prevent or interfere with the wireless transmissions between the transmitter and the receiver.

In one embodiment, with respect to the adaptive beamforming antennas, they have three phases of operations. The three phases of operations are the training phase, a searching phase, and a tracking phase. The training phase and searching phase occur during initialization. The training phase determines the channel profile with predetermined sequences of spatial patterns $\{A\hat{i}\}$ and $\{B\hat{j}\}$. The searching phase computes a list of candidate spatial patterns $\{A\hat{i}\}$, $\{B\hat{j}\}$ and selects a prime candidate $\{A\hat{0}, B\hat{0}\}$ for use in the data transmission between the transmitter of one transceiver and the receiver of another. The tracking phase keeps track of the strength of the candidate list. When the prime candidate is obstructed, the next pair of spatial patterns is selected for use.

In one embodiment, during the training phase, the transmitter sends out a sequence of spatial patterns $\{A\hat{i}\}$. For each spatial pattern $\{A\hat{i}\}$, the receiver projects the received signal onto another sequence of patterns $\{B\hat{j}\}$. As a result of the projection, a channel profile is obtained over the pair $\{A\hat{i}\}$, $\{B\hat{j}\}$.

In one embodiment, an exhaustive training is performed between the transmitter and the receiver in which the antenna of the receiver is positioned at all locations and the transmitter sending multiple spatial patterns. Exhaustive training is well-known in the art. In this case, M transmit spatial patterns are transmitted by the transmitter and N received spatial patterns are received by the receiver to form an N by M channel matrix. Thus, the transmitter goes through a pattern of transmit sectors and the receiver searches to find the strongest signal for that transmission. Then the transmitter moves to the next sector. At the end of the exhaustive search process, a ranking of all the positions of the transmitter and the receiver and the signals strengths of the channel at those positions has been obtained. The information is maintained as pairs of positions of where the antennas are pointed and signal strengths of the channels. The list may be used to steer the antenna beam in case of interference.

In an alternative embodiment, bi-section training is used in which the space is divided in successively narrow sections with orthogonal antenna patterns being sent to obtain a channel profile.

Assuming DSP 101 is in a stable state and the direction the antenna should point is already determined. In the nominal state, the DSP will have a set of coefficients that it sends the phase shifters. The coefficients indicate the amount of phase the phase shifter is to shift the signal for its corresponding antennas. For example, DSP 101 sends a set digital control information to the phase shifters that indicate the different phase shifters are to shift different amounts, e.g., shift 30 degrees, shift 45 degrees, shift 90 degrees, shift 180 degrees, etc. Thus, the signal that goes to that antenna element will be shifted by a certain number of degrees of phase. The end result of shifting, for example, 16, 34, 32, 64 elements in the array by different amounts enables the antenna to be steered in a direction that provides the most sensitive reception location for the receiving antenna. That is, the composite set of shifts over the entire antenna array provides the ability to stir where the most sensitive point of the antenna is pointing over the hemisphere.

Note that in one embodiment the appropriate connection between the transmitter and the receiver may not be a direct path from the transmitter to the receiver. For example, the most appropriate path may be to bounce off the ceiling.

The Back Channel

In one embodiment, the wireless communication system includes a back channel, or link, for transmitting information between wireless communication devices (e.g., a transmitter and receiver, a pair of transceivers, etc.). The information is related to the beamforming antennas and enables one or both of the wireless communication devices to adapt the array of antenna elements to better direct the antenna elements of a transmitter to the antenna elements of the receiving device together. The information also includes information to facilitate the use of the content being wirelessly transferred between the antenna elements of the transmitter and the receiver.

In FIG. 2, back channel 220 is coupled between DSP 216 and DSP 201 to enable DSP 216 to send tracking and control information to DSP 201. In one embodiment, back channel 220 functions as a high speed downlink and an acknowledgement channel.

In one embodiment, the back channel is also used to transfer information corresponding to the application for which the wireless communication is occurring (e.g., wireless video). Such information includes content protection information. For example, in one embodiment, the back channel is used to transfer encryption, information (e.g., encryption keys and acknowledgements of encryption keys) when the transceivers are transferring HDMI data. In such a case, the back channel is used for content protection communications.

More specifically, in HDMI, encryption is used to validate that the data sink is a permitted device (e.g., a permitted display). There is a continuous stream of new encryption keys that is transferred while transferring the HDMI datastream to validate that the permitted device has not been changed. Blocks of frames for the HD TV data are encrypted with different keys and then those keys have to be acknowledged back on back channel 220 in order to validate the player. Back channel 220 transfers the encryption keys in the forward direction to the receiver and acknowledgements of key receipts from the receiver in the return direction. Thus, encrypted information is sent in both directions.

The use of the back channel for content protection communications is beneficial because it avoids having to complete a lengthy retraining process when such communications are sent along with content. For example, if a key from a transmitter is sent alongside the content flowing across the primary link and that primary link breaks, it will force a lengthy retrain of 2-3 seconds for a typical HDMI/HDCP system. In one embodiment, this separate bi-directional link that has higher reliability than the primary directional link given its omni-directional orientation. By using this back channel for communication of the HDCP keys and the appropriate acknowledgement back from the receiving device, the time consuming retraining can be avoided even in the event of the most impactful obstruction.

During the active period when the beamforming antennas are transferring content, the back channel is used to allow the receiver to notify the transmitter about the status of the channel. For example, while the channel between the beamforming antennas is of sufficient quality, the receiver sends information over the back channel to indicate that the channel is acceptable. The back channel may also be used by the receiver to send the transmitter quantifiable information indicating the quality of the channel being used. If some form of interference (e.g., an obstruction) occurs that degrades the quality of the channel below an acceptable level or prevents transmissions completely between the beamforming antennas, the receiver can indicate that the channel is no longer acceptable and/or can request a change in the channel over the back channel. The receiver may request a change to the next channel in a predetermined set of channels or may specify a specific channel for the transmitter to use.

In one embodiment, the back channel is bi-directional. In such a case, in one embodiment, the transmitter uses the back channel to send information to the receiver. Such information may include information that instructs the receiver to position its antenna elements at different fixed locations that the transmitter would scan during initialization. The transmitter may specify this by specifically designating the location or by indicating that the receiver should proceed to the next location designated in a predetermined order or list through which both the transmitter and receiver are proceeding.

In one embodiment, the back channel is used by either or both of the transmitter and the receiver to notify the other of specific antenna characterization information. For example, the antenna characterization information may specify that the antenna is capable of a resolution down to 6 degrees of radius and that the antenna has a certain number of elements (e.g., 32 elements, 64 elements, etc.).

In one embodiment, communication on the back channel is performed wirelessly by using interface units. Any form of wireless communication may be used. In one embodiment, OFDM is used to transfer information over the back channel. In another embodiment, continuous-phase modulation (CPM) with low peak-to-average power ratio is used to transfer information over the back channel.

Receiver Overview

Figure 4:
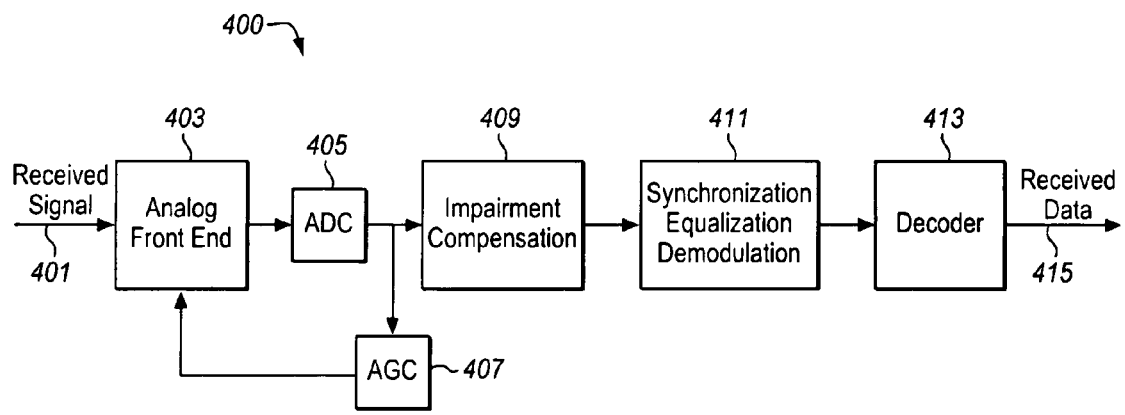
FIG. 4 is a block diagram of one embodiment of a receiver that includes a decoder.

FIG. 4 shows a block diagram of one embodiment of a communication receiver 400 for digital data. Such a receiver can be incorporated into the receiver device 141 of FIGS. 1 and 131 of FIG. 3. In one embodiment, the receiver components of FIG. 4 are incorporated into the baseband signal processing system 111 of FIG. 1.

The receiver includes an analog front end 403 to amplify a received signal 401 to a suitable level for an analog-to-digital converter (ADC) 405 to which it is connected. The analog front end can perform a variety of different beamforming, filtering, amplifying, and regenerating functions in the analog domain to reject interference and noise. It can also contain single or multiple frequency conversion stages to shift the signal frequency to the operational frequency band of the ADC. Various analog equalization techniques can also be used to limit the time-spreading of the signal, reduce delay shifts, limit multipath interference and to perform other processes. Any one or more of these functions may alternatively or additionally be provided in the antenna 110 of FIG. 1.

The ADC 405 is coupled to the analog front end to convert the analog signal that it receives from the front end to a digital signal for further processing. The digital output of the ADC is coupled to an automatic gain control (AGC) 407 to measure the signal power of the digital signal output of the ADC. The AGC is also coupled to the analog front end to send control signals to the analog front end to increase or decrease the gain or amplification of the receive signal. This allows the ADC output to be maintained at any desired or predefined level.

The ADC output is also coupled to an impairment compensation module 409. This module can perform any of a variety of different functions to compensate for any nonlinearities or other impairments in the received signal 401, the analog front end, and the ADC. For a wireless communication system, for example, one possible impairment is the imbalance between the in-phase and quadrature-phase components. Another possible impairment is the frequency offset between the oscillators in the transmitter and the receiver. In data storage, a possible impairment is the nonlinearities in the magnetic medium, such as a hard disk or tape and the corresponding read head. Additional circuits or signal processing blocks may be used to estimate these impairments (not shown).

The output of the impairment compensation module is coupled to a synchronization, equalization, demodulation module 411. This module performs remaining receiver functions that can include one or all of synchronization, equalization, and demodulation. In one embodiment, the synchronization obtains the best timing for each bit, block, or frame of the received signal. In some cases, the synchronization needs to acquire the carrier phase or carrier frequency of the transmitter. The equalization portion of the module can be used to equalize the signal for gain and phase variations in different frequency bands. Those variations may be induced by the channel, analog front end, and other components in between and a transmitter and a receiver. The demodulator portion of the module retrieves the original data embedded in the received signal. Typically, the demodulator provides an estimation of the probability, the ratio of probability, or logarithmic of the ratio of the probability for different symbols or data embedded in the received signal 401. The particular form and nature of the demodulator will be determined by the modulation that has been applied to the signals by the transmitter.

The output of the synchronization, equalization, and demodulator module is applied to a decoder 413. The decoder then produces a received data stream 415. The decoder may be present in the baseband signal processing 111 of FIG. 1 or in the DSP 112 of FIG. 1. In one embodiment, the communication transmitter, for example transmitter 140 generates a signal with an intentional correlation between different parts of the signal. This correlation can be provided by the redundancy of an error correction code or a convolutional code, or in other ways. The decoder provides an estimation of the transmitter data based on the correlation of the received data. This can be done using a Viterbi methodology or any similar methodology.

The received signals 401 can be correlated at different times with each other due to various effects. For example, the communication channel between the transmitter and the receiver may give correlation to adjacent signal samples due to the time-spreading of the impulse response of the communication channel. Certain modulation schemes also have memory and may give correlation to adjacent modulated symbols. The redundancy of error correction code is also a correlation of different transmitted symbols.

In one embodiment, the memory or correlation of a signal may be described as a finite state machine. The Viterbi algorithm is a method or technique to retrieve the original signal of the finite state machine from its noise-contaminated output. The Viterbi algorithm can also, or alternatively, be used as an equalizer to take the received signal and to determine the original signal sequence before it was corrupted by the communication channel between the transmitter and receiver. The Viterbi algorithm is used, for example, as an equalizer in magnetic and optical data storage. For a modulation scheme with memory and described as a finite state machine, the Viterbi algorithm can be used as the demodulator to retrieve the original symbol.

The Viterbi algorithm is frequently used to demodulate the signal in GSM (Global System for Mobile Communications) and other cellular data and telephone systems. For error correction code with a finite state machine description, like convolutional code, the Viterbi algorithm can be used as the decoder. The Viterbi algorithm is also typically used in WiMAX (Worldwide Interoperability for Microwave Access) and WiFi (Wireless Fidelity) wireless communication as the decoder. Other communication systems also use trellis-coded modulation schemes for combined coding and modulation. The Viterbi algorithm can be and sometimes is also used in those systems, including voice-band modem and twisted-pair based Gigabit Ethernet.

While the present description will focus on the decoder 413, in the block diagram of FIG. 4, the branch metric techniques described below may be used in equalization, demodulation and decoding. This corresponds to block 411 and 413.

Figure 5:
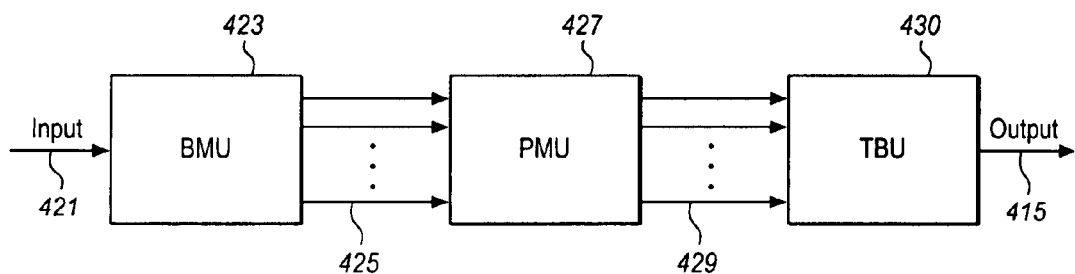
FIG. 5 is a block diagram of one embodiment of a Viterbi algorithm for use in decoders, error correction and equalizers such as those shown in FIG. 4.

FIG. 5 shows a block diagram of a Viterbi algorithm as it can be implemented in one embodiment of the decoder 413 of FIG. 4. The blocks of FIG. 5 can be implemented as hardware, firmware, or software. The input 421, in one embodiment, comes from the synchronization, equalization and demodulator module 413 as a sequence of values of $x_{k,m}$. In the example of FIG. 4, the incoming values 421 are proportional or approximately proportional to the logarithm of the ratio of the probability for different symbols or different data embedded in the received signal 401. For other applications the input or received signal may be different.

In FIG. 5, the input sequence 421 is applied to a branch metric unit (BMU) 423 to calculate branch metric values 425. The branch metric values can correspond to the distance, for example a Euclidean or Hamming distance, between the input values from the receiver and the known values at the transmitter. Alternatively, the branch metric values can correspond to the correlation between the input values from the receiver and the known values at the transmitter. In the example of a convolutional decoder, the known values in the transmitter may be called codewords or trellis output values.

The translation between distance and correlation is based on a subtraction of power and scaling in the branch metric unit. If xy is the correlation between x and y, it can be derived by the distance of $(x-y)^2$, that is by subtracting the powers of $x^2$ and $y^2$, then scaling by $-\frac{1}{2}$. In the description that follows, it is assumed that the BMU provides its output as the "correlation" but "distance" also serves the same purpose and can be used instead of "correlation."

The branch metric values 425 are applied to a path metric unit (PMU) 427. The PMU can be in the form of an accumulate-and-compare select (ACS) unit, but other forms are also possible. The PMU determines metrics for paths through a decision tree or trellis. The result from the PMU is applied to a traceback unit (TBU) 430 which selects a path through the tree or trellis to produce the decoded output bit stream 415.

Figure 6A:
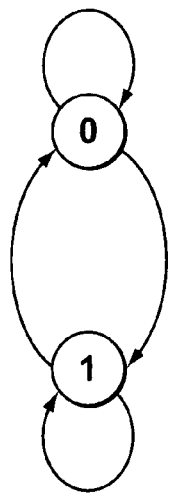
FIG. 6A is a state diagram for a possible signal.
Figure 6B:
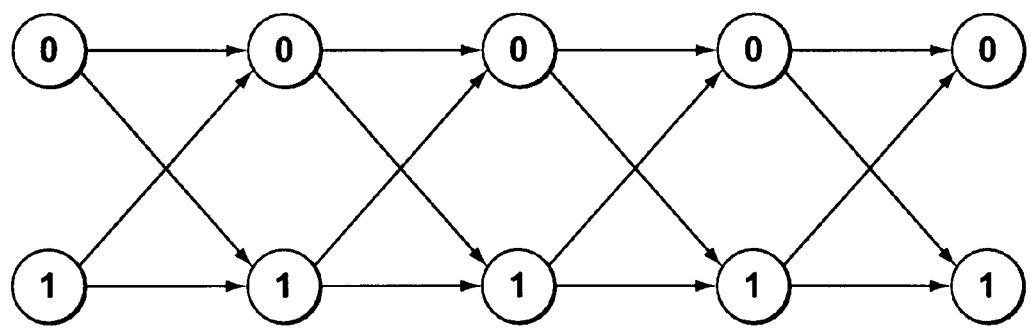
FIG. 6B is a trellis diagram for a possible signal.

As described in more detail below, the BMU determines a large number of branch metric values to compute distances for almost all possible decoder outcomes. This can be expensive and complex. By modifying these calculations in a few ways, the complexity of the calculation and of the BMU, can be significantly reduced. In some embodiments, the required number of bits in a hardware implementation of the PMU is also reduced by at least one bit without sacrificing the performance of the Viterbi algorithm For a binary bit sequence, FIG. 6A shows the possible states of a finite-state machine that transitions with each bit in the sequence. The two states of the binary sequence in FIG. 6A are "0" and "1". As shown in FIG. 6A, the "0" state can transition to "1" or remain at "0," while the "1" state can transition to "0" or remain at "1." The change of states in the finite-state machine as a function of operation stage is shown in FIG. 6B. These two figures represent the same finite state machine. FIG. 6B presents the state machine stage-by-stage as a linear progression from left to right, rather than as a state transfer as in FIG. 6A. FIG. 6B is referred to as a trellis diagram.

Each branch of the finite state machine of FIG. 6A or the trellis diagram of FIG. 6B represents a certain transition probability, or logarithm of the ratio of probability, called log-likelihood ratio (LLR). Referring back to the example of FIG. 5, the PMU finds the optimal branch to enter the state. The TBU starts from the final state at the final stage to the beginning state at the beginning stage to determine the best path. Graphically, the TBU using input from the PMU finds an optimal path to traverse the trellis diagram of FIG. 6B.

Branch Metric Unit

Figure 7:
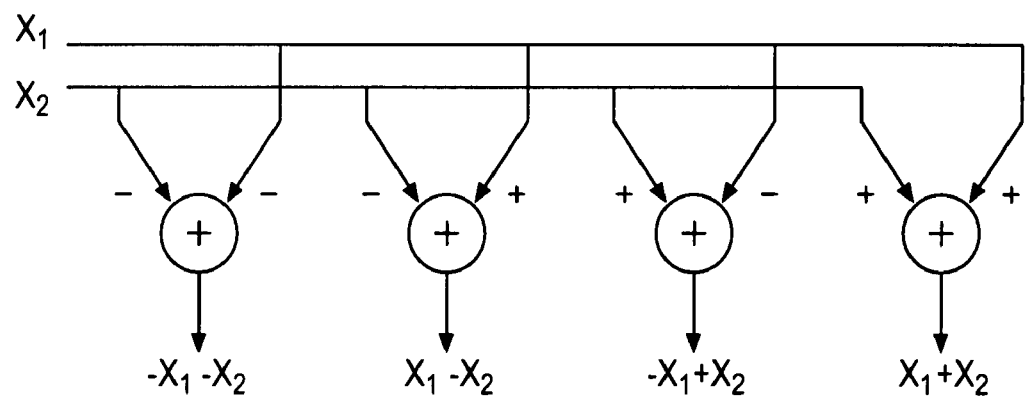
FIG. 7 is a logic flow diagram of a conventional branch metric unit for the Viterbi algorithm of FIG. 5 applied to decode a rate-½ convolutional code with the state diagram of FIG. 6A or the trellis diagram of FIG. 6B.

Typically, a BMU in a Viterbi decoder finds the branch metric of all of the branches as shown in FIG. 6B. FIG. 7 shows a conventional implementation of a branch metric unit corresponding to the finite state machine of FIGS. 6A and 6B. There are two inputs $(x_1, x_2)$ for considered by a rate-½ convolutional decoder. In FIG. 7, the BMU performs four branch metric calculations which represent all of the possible branch distances for the two inputs. As shown in the diagram, these calculations correspond to $-x_1-x_2$, $-x_1+x_2$, $+x_1-x_2$, $+x_1+x_2$.

Figure 8:
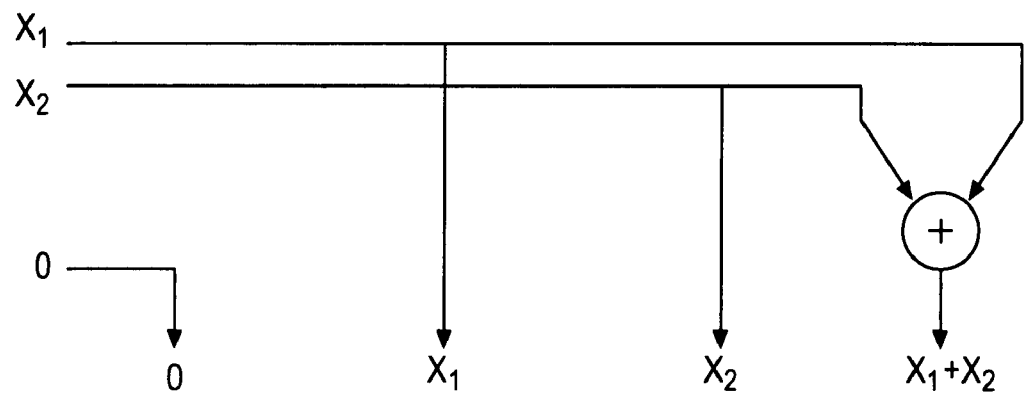
FIG. 8 is a logic flow diagram of a one embodiment of an improved branch metric unit for the Viterbi algorithm of FIG. 5 applied to decode a rate-½ convolutional code with the state diagram of FIG. 6A or the trellis diagram of FIG. 6B.

In one embodiment, this invention simplifies the branch metric unit for a Viterbi algorithm as shown in FIG. 8. Instead of computing all four metrics, $-x_{k,1}-x_{k,2}$, $-x_{k,1}+x_{k,2}$, $+x_{k,1}-x_{k,2}$, $+x_{k,1}+x_{k,2}$, only one metric is computed $x_{k,1}+x_{k,2}$. The branch metric unit provides four values to the path metric unit, $0, x_{k,2}, x_{k,1}$, and $x_{k,1}+x_{k,2}$. However, three of these $0, x_{k,2}$, and $x_{k,1}$ are already known and do not require calculation.

FIG. 8 shows one embodiment of a branch metric unit for this invention for the finite state machine of FIGS. 6A and 6B. These apply to the rate-½ convolutional decoder. Comparing FIG. 7 with FIG. 8 clearly shows the reduction in computations. In the example of FIG. 7, the calculation of the branch metrics requires four operations. In the example of FIG. 8, the calculation of the branch metrics requires only one single operation.

Improved BMU Example for Rate-½ Convolutional Codes

Mathematically, the Viterbi algorithm is not sensitive to scaling the branch metric. The Viterbi algorithm is also not sensitive to adding a common term to all of the branch metric values, particularly when the common term is added at the same decoding stage. In one embodiment, for a rate-½ convolutional code, the branch metric is scaled by a factor of ½. A common term $(x_{k,1}+x_{k,2})$ is added to all the branch metric values. This can be expressed as first adding the common term and then dividing the resultant set by a scaling factor of ½. Equivalently, the new set of branch metrics can be written by first scaling the original branch metrics by ½ and adding ½$(x_{k,1}+x_{k,2})$ to all the scaled branch metric values.

Table 1 shows the original branch metric for a conventional rate-½ convolutional code. The center column shows the scaling and common term addition to be performed. The right hand column then shows the resulting branch metric. In a typical implementation, the calculations of the center column are performed only to configure the BMU. In use, the BMU performs only the calculation indicated by the right-hand column, Modified branch metric. This provides the significant computational benefit suggested in the Table.

Table 1 indicates that the common term is selected specifically in order to reduce the number of computations. In this embodiment, the common term of ½$(x_{k,1}+x_{k,2})$ results in the least total number of computations. For other codecs and for particular hardware or software implementations, a different common term may provide more desirable results. Table 1 shows that the conventional branch metric requires four operations, either plus or minus. On the other hand, the modified branch metric computation requires only one operation for this specific example.

TABLE 1

Modification of the branch metrics

| Original branch metric | Scale + common term | Modified branch metric |
|---|---|---|
| $-x_{k,1} - x_{k,2}$ | ½$(-x_{k,1} - x_{k,2})$ + ½$(x_{k,1} + x_{k,2})$ | 0 |
| $-x_{k,1} + x_{k,2}$ | ½$(-x_{k,1} + x_{k,2})$ + ½$(x_{k,1} + x_{k,2})$ | $x_{k,2}$ |
| $+x_{k,1} - x_{k,2}$ | ½$(+x_{k,1} - x_{k,2})$ + ½$(x_{k,1} + x_{k,2})$ | $x_{k,1}$ |
| $+x_{k,1} + x_{k,2}$ | ½$(+x_{k,1} + x_{k,2})$ + ½$(x_{k,1} + x_{k,2})$ | $x_{k,1} + x_{k,2}$ |

FIG. 7 shows how a branch metric determination might be performed using the original branch metric of the left-hand column of Table 1. In FIG. 7, the incoming digital signal has components $x_1$, and $x_2$. The BMU runs correlations through a series of adders each indicated by a + sign in a circle. The adders attach different signs positive and negative to each of the two components of the input digital signal and then sum the two values. Accordingly, this hardware performs each of the four calculations shown in the left-hand column of Table 1.

In FIG. 8, the BMU is modified to perform the correlations as suggested by the right-hand column of Table 1 using the corresponding reduced set of calculations. Typically the calculations of the center column are not performed in use. These are used only to determine the simplified calculations and to show how they are derived. The particular form and configuration of the center column can be adapted to suit different applications. The example in Table 1 has been found to provide significant improvements in a rate-½ convolutional decoder.

In FIG. 8, the same two components $x_1$ and $x_2$ are applied as inputs. Four correlation results are obtained. However, these results are obtained using only one adder. FIG. 8 shows the dramatic reduction in cost and complexity that the modified branch metric permits. From an original four calculations in FIG. 7, the set of calculations is reduced to 1. The same model of Table 1 has been applied to much more complex convolutional codes in order to characterize the reduced set of calculations. This is shown in Table 2, discussed in more detail below.

A further benefit of the modified branch metric is indicated by the range of values in the two figures. The FIG. 7 BMU obtains results that range from $-(x_1+x_2)$ to $+(x_1+x_2)$. This is a total range of $2(x_1+x_2)$. On the other hand the FIG. 8 BMU obtains results that range from 0 to $(x_1+x_2)$ for a total of $(x_1+x_2)$ or half the range of the FIG. 7 BMU. In digital signal processing, the reduction by a factor of ½ means that the hardware that handles these metrics requires one less bit to process the values, a further reduction in cost and complexity. At the same time the results from the traceback unit are not changed.

Improved BMU for Other Conditions

The scaling and common term approach may be applied to many different convolutional codes and not just the rate-½ code. Stated more generally, if there are M inputs at each stage of $x_{k,m}$ where $m=1, 2, \ldots, M$, the conventional branch metric corresponding to the codeword of $c_{k,m}$, where $m=1, 2, \ldots, M$, various branch metric values are given by Equation 1 below.

$$\sum_{m=1}^{M} (2c_{k,m} - 1)x_{k,m} \qquad \text{Eq. 1}$$

For a convolutional encoder $c_{k,m}$ is either 0 or 1 and therefore $2^M$ different branch metric values are typically computed. Using the conventional method one set of branch metrics requires $(M-1)2^M$ addition or subtraction operations. As mentioned above the number of operations can present a significant computational cost.

Extending the approach suggested in Table 1, using a scale factor of ½ plus a common term. A generalized statement of the common term is provided by Equation 2 below.

$$\frac{1}{2}\sum_{m=1}^{M} x_{k,m} \qquad \text{Eq. 2}$$

Combining the common term with the conventional statement of the branch metrics of Equation 1 provides the set of modified branch metrics as stated in Equation 3 below. As in the Table 1 example, a BMU is configured to determine the BMU correlations using the reduced set of calculations of Eq. 3. These calculation already take into account Equations 1 and 2.

$$\sum_{m=1}^{M} c_{k,m} x_{k,m} \quad \text{Eq. 3}$$

It may be noted that no computation is required if $c_{k,m}=0$. Accordingly, the number of addition operations required to determine the set of modified branch metrics is only $(M-2)2^{M-1}-1$. Table 2 shows the number of operations required to generate the branch metrics under Equation 1 in the second column, versus under Equation 3 in the third column. The percentage improvement is shown in the right column. While Table 2 ends with M=7, the improvement stays above 50% even when M, the number of inputs, is very large.

TABLE 2

Required Number of Operations to Generate the Branch Metric

| Number of inputs at each state, M | Operations to generate the original branch metric | Operations to generate the modified branch metric | Improvement |
|---|---|---|---|
| 2 | 4 | 1 | 75% |
| 3 | 16 | 5 | 69% |
| 4 | 48 | 17 | 65% |
| 5 | 128 | 49 | 62% |
| 6 | 320 | 129 | 60% |
| 7 | 768 | 321 | 58% |

The reduction in computations shown in Table 2 can be understood by looking more closely at the computations that are actually performed. The original branch metrics, as stated for example in Equation 1, are calculated by multiplying the inputs to the branch metric unit as shown in Equation 4.

$$x_{k,m}, m=1, 2, \ldots, M \text{ multiplied by } 2c_{k,m}-1=+1 \text{ or } -1. \quad \text{Eq. 4}$$

On the other hand the modified branch metrics are calculated by multiplying the inputs to the branch metric unit as shown in Equation 5.

$$x_{k,m}, m=1, 2, \ldots, M, \text{ multiplied by } c_{k,m}=0 \text{ or } 1. \quad \text{Eq. 5}$$

Since no operation is required for a multiplication with zero, the modified branch unit reduces the number of operations by at least 50%.

In another embodiment, scaling the branch metrics with the factor of ½, can be combined with subtracting a common term instead of adding a common term. For purposes of readability, "subtracting" is used, however, it should be understood that "subtracting" is simply adding a negative number. Accordingly, "subtracting" and "adding" may both be used to describe the same operations. Using the common term of Equation 2 and subtracting it from the branch metric of Equation 1 produces a modified branch metric value as stated in Equation 6 below.

$$\sum_{m=1}^{M} (c_{k,m} - 1) x_{k,m} \quad \text{Eq. 6}$$

In another embodiment, the original branch metric can be as stated in Equation 7 below.

$$-\sum_{m=1}^{M} (2c_{k,m} - 1) x_{k,m} \quad \text{Eq. 7}$$

Subtracting the common term and scaling can then be used to obtain either a modified branch metric as stated in Equation 8.

$$\sum_{m=1}^{M} (1 - c_{k,m}) x_{k,m} \quad \text{Eq. 8}$$

or to obtain a modified branch metric as stated in Equation 9 below.

$$-\sum_{m=1}^{M} c_{k,m} x_{k,m} \quad \text{Eq. 9}$$

Accordingly, in one embodiment, the modified branch metrics can either collect all terms of logical true or logical false corresponding to the output of the convolutional encoder of $c_{k,m}=0$ or 1. In addition, in another embodiment, in order to reduce the complexity of computing the branch metric value, some multiplicative terms with the inputs $x_{k,m}$, $m=1, 2, \ldots, M$, can be substituted with zero to reduce the number of operations.

The number of inputs for a convolutional codec for each decoding stage is typically in the range of 2 to 3 per stage in a radix-2 decoder design. The number of inputs is increased by a factor of 2 or 3 in the radix-4 and radix-8 design, respectively. When a Viterbi algorithm is used for channel equalization, the number of inputs for channel equalization depends on the spreading of the channel. Accordingly, the number of computation in the BMU can be very large.

As mentioned above, the Viterbi algorithm is typically implemented in a receiver such as that of FIGS. 1 and 4. When the receiver is implemented using an application specific integrated circuit (ASIC) or any other specialized hardware or firmware, the number of bits in the fixed point implementation can be reduced. The required number of bits depends on the range of possible values.

In the example of FIG. 7, if it is assumed that all of the inputs are positive. Without loss of generality, the range of branch metric values is $2(x_1+x_2)$ from maximum to minimum. In the implementation of FIG. 8, the corresponding range is $x_1+x_2$. The difference in range is accordingly reduced by a factor of 2. This allows the number of bits necessary to characterize this range to correspondingly be reduced by 1 bit. When the branch metric unit has one less bit, the connected path metric unit also requires one, less bit. This allows both the branch metric unit and path metric unit to be simplified with corresponding possibilities for reducing cost, power consumption, delay, and related factors.

As will be understood by those of average skill in the art, the complexity of a branch metric unit for typical Viterbi algorithm can be reduced from 50% to 75%. This is accomplished without sacrificing the system performance, reliability, and accuracy.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A decoder for a received digital signal comprising:
   a branch metric unit to determine a correlation between symbols in the digital signal, in part, by adding a common term to all branch metric values before determining the correlation, the common term being based on a combination of input symbols;
   a path metric unit coupled to the branch metric unit to determine metrics for paths through a decision tree; and
   a traceback unit coupled to the path metric unit to select a path and a corresponding symbol sequence in the received digital signal based on the path metric determinations.

2. The decoder of claim 1, wherein the combination of input signals comprises a sum of each of the inputs to the branch metric unit at each stage used in calculating a codeword from the digital signal.

3. The decoder of claim 1, wherein the combination of input signals comprises a difference of each of the inputs to the branch metric unit at each stage used in calculating a codeword from the digital signal.

4. The decoder of claim 1, wherein the combination of input signals is selected to reduce the total number of calculations required to determine the correlations.

5. The decoder of claim 1, wherein the branch metric unit is configured to determine correlations using a reduced set of calculations taking into consideration the addition of the common term.

6. The decoder of claim 1, wherein the branch metric unit further scales the branch metric values and the common term to normalize the determined correlations.

7. The decoder of claim 6, wherein the branch metric unit scales by multiplying the branch metric values by one half.

8. The decoder of claim 2, wherein the branch metric unit adds the common term and scales by equating some branch metric values to zero.

9. The decoder of claim 5, wherein the branch metric unit adds the common term and scales by equating some branch metric values to a value of an input symbol.

10. A method comprising:
    receiving a digital signal in a buffer;
    determining a set of branch metric values for symbols of the received digital signal, the branch metric values indicating a correlation between symbols obtained using a reduced calculation set, the reduced calculation set being obtained by adding a common term to all of the branch metric values before determining the correlation;
    determining path metrics for paths through a decision tree using the branch metric values;
    selecting a path and a corresponding symbol sequence in the received digital signal using the path metric values.

11. The method of claim 10, wherein the common term is selected to reduce the total number of calculations to determine the path metric values.

12. The method of claim 10, wherein the common term is a sum of each of the inputs to the branch metric determinations at each stage used in calculating a codeword from the digital signal.

13. The method of claim 10, wherein the reduced calculation set is further obtained by scaling the branch metric values and the common term to normalize the determined branch metric values.

14. The method of claim 13, wherein scaling comprises scaling by one half.

15. A machine-readable to store a set of instructions that when executed by a processor cause the processor to perform operations comprising:
    determining a set of branch metric values for symbols of a received digital signal, the branch metric values indicating a correlation between symbols obtained using a reduced calculation set, the reduced calculation set being obtained by adding a common term to all of the branch metric values before determining the correlation;
    determining path metrics for paths through a decision tree using the branch metric values; and
    selecting a path and a corresponding symbol sequence in the received digital signal using the path metric values.

16. A method comprising:
    determining branch metric values for possible correlations of an encoded input and corresponding output by multiplying each possible input with each possible output at each stage of an encoder;
    determining path metrics for paths through a decision tree using the branch metric values; and
    selecting a path and a corresponding symbol sequence in the received digital signal using the path metric values.

17. The method of claim 16, wherein the encoded output has at least one possible value of zero and wherein multiplying by zero is performed by substituting zero for the multiplication result.

18. The method of claim 16, wherein the encoded output has at least one possible value of one and wherein multiplying by one is performed by equating the corresponding branch metric values to a value of an input symbol.

19. The method of claim 16, wherein determining branch metric values comprises collecting all terms in which the encoded output is zero and returning a zero as the branch metric and separately collecting all terms in the which the encoded output is 1 and returning the input value as the branch metric.

20. The method of claim 16 wherein determining the branch metrics comprises generating a sequence of results comprising zero, the first input, the second input and a sum of the first input and the second input.

* * * * *